United States Patent [19]
Bansal

[11] Patent Number: 5,504,703
[45] Date of Patent: Apr. 2, 1996

[54] SINGLE EVENT UPSET HARDENED CMOS LATCH CIRCUIT

[75] Inventor: Jai P. Bansal, Manassas, Va.

[73] Assignee: Loral Federal Systems Company, McLean, Va.

[21] Appl. No.: 382,112

[22] Filed: Feb. 1, 1995

[51] Int. Cl.$^6$ ................................. G11C 11/412
[52] U.S. Cl. ................. 365/156; 365/194; 365/189.05
[58] Field of Search .................. 365/154, 156, 365/190, 194, 189.05

[56] References Cited

U.S. PATENT DOCUMENTS

| | | | |
|---|---|---|---|
| 4,130,892 | 12/1978 | Gunckel et al. | 365/156 |
| 4,344,154 | 8/1982 | Klaas et al. | 365/194 |
| 4,590,508 | 5/1986 | Hirakawa et al. | 365/154 |
| 4,725,981 | 2/1988 | Rutledge | 365/154 |
| 4,809,226 | 2/1989 | Ochoa | 365/156 |
| 4,914,629 | 4/1990 | Blake . | |
| 4,956,814 | 9/1990 | Houston | 365/154 |
| 4,995,000 | 2/1991 | Terrell | 365/154 |
| 5,018,102 | 5/1991 | Houston | 365/154 |
| 5,040,146 | 8/1991 | Mattausch et al. | 365/190 |
| 5,046,044 | 9/1991 | Houston et al. | 365/190 |
| 5,132,771 | 7/1992 | Yamanaka et al. | 365/154 |
| 5,194,749 | 3/1993 | Meguro et al. | 365/156 |
| 5,301,146 | 4/1994 | Hama | 365/156 |
| 5,404,326 | 4/1995 | Okamoto | 365/156 |

FOREIGN PATENT DOCUMENTS

| | | |
|---|---|---|
| 58-147890 | 9/1983 | Japan . |
| 61-165900 | 7/1986 | Japan . |
| 63-166260 | 7/1988 | Japan . |

Primary Examiner—Joseph E. Clawson, Jr.
Attorney, Agent, or Firm—Lane, Aitken & McCann

[57] ABSTRACT

SEU immunity is provided in a cross-coupled CMOS latch circuit by inserting a pair of series connected invertors between the drain node of one CMOS invertor and the gate node of the other CMOS invertor and a pair of series connected invertors between the drain node of the other CMOS invertor and the gate node of the one CMOS invertor. The invertor pairs delay the propagation of a change in voltage induced by an energetic ion strike at the off drain of one invertor to the gates of the transistors making up the other cross coupled invertor. The invertor connected to the gates of the transistors affected by the ion strike help in restoring the circuit to its original state.

6 Claims, 4 Drawing Sheets

5,504,703

SINGLE EVENT UPSET HARDENED CMOS LATCH CIRCUIT

BACKGROUND OF THE INVENTION

1. Field of the Invention

This invention relates to a CMOS latch circuit with improved radiation hardening, and more particularly to a hardening circuit element which can be conveniently incorporated into an application specific latch substrate and which allows fast write setup over a wide temperature range.

2. Description of the Prior Art

In space applications, CMOS static random access memories (SRAMs), and other data storage circuits, such as latches, shift registers, and flip flops, are sensitive to state upset when struck by energetic, heavy ions. A reduction in the integrated circuit device dimensions increases the susceptibility of SRAMs, and other logic circuits, to soft errors caused by upset when the diffusion nodes of these circuits are hit by energetic heavy ions, such as iron, krypton or argon. The phenomenon of a logic state change or a soft error produced by a single ion hit is known as a single event upset (SEU). In space applications, as the number and density of memory cells and logic circuits in the data processing systems increases, the SEU error rate is an increasingly serious problem.

FIGS. 1a and 1b respectively are schematic diagrams of a well known prior art CMOS static random access memory (SRAM) cell and a CMOS latch circuit without radiation hardening.

Single event upset (SEU) or soft error can occur in the SRAM cell or latch circuit shown in FIGS. 1a and 1b respectively following a high energy ion strike at the "off" N and P channel drains (node 1 or node 2) in these circuits. When a high energy ion strikes the drain depletion region, it generates electron hole pairs, which are collected as reverse saturation current. Such currents generated in the drain region of the off transistor change the drain node voltage (for example node 1) and the gate voltage of the opposite invertor transistors (T3 and T4). These changes in drain and gate voltages tend to destabilize the logic states of the latch or SRAM cell circuits.

The amount of change in the node voltage depends on the amount of charge deposited by the high energy ion's strike at the off drain region. The magnitude and the duration of the voltage transients are critical and determine whether or not an SEU occurs. The minimum critical charge (QC) that produces an upset depends upon the characteristics of the transistors and the parasitic capacitances.

In the conventional latch circuit shown in FIG. 1b, data is entered from input to the invertor made up by transistors T5 and T6 while clock at the gate of transistor T7 is high. A high input at data node will produce a high voltage (logic) level at the drains of transistors T1 and T2 (node 1). P-channel transistor T1 is on and N-channel transistor T2 is off. A high level at node 1 and at the gates of transistors T3 and T4 produces a low voltage (logic) level at node 2, keeping T3 off and T4 on. The low voltage level at node 2 latches node 1 to high voltage level even when the clock signal at the gate of the T7 has dropped to low voltage level. Now the latch circuit is in a stable state with node 1 at high and node 2 at low voltage levels.

During the clock cycle, when clock is at low voltage level, if a high energy ion strikes node 1, reverse current in the drain of T2 will pull down the node 1 voltage from a high level to possibly below ground level with the T2 drain to substrate junction becoming forwardly biased. A low voltage at node 1 and simultaneously at the gates of T3 and T4, raises the node 2 voltage to high level and this in turn might latch the node 1 to a low voltage level. The latch circuit states having been thusly upset will produce soft logic errors at the latch output nodes Q and −Q. Similarly, a SRAM cell circuit can be written by a high energy ion's strike storing an erroneous data. SEU can also happen due to a strike at node 2.

As shown in FIGS. 2a and 2b, respectively, in the prior art, SEU immunity or hardness of a SRAM cell and a latch circuit is provided by connecting feedback resistors from the drains of one invertor to the gates of the second invertor; namely, RF1 from node 1 to gates of T3 and T4 and RF2 from drains of T3 and T4 to gates of T1 and T2. C1 and C2 represent the interconnection and parasitic capacitances at the transistor gates. Voltage change at node 1 is delayed by the time constant RF1×C1 before it appears at the gates of T3 and T4. During this time node 1 voltage starts to recover because the voltage of gates of T1 and T2 has not yet changed, and the circuit stabilizes to its original logic states. Lightly doped polysilicon resistors RF1 and RF2 require a masking and ion implant process step during the wafer fabrication. Resistor values or doping level are selected to achieve a certain level of immunity to SEU phenomenon.

Drawbacks with the feedback resistor solution for SEU are:

1. The polysilicon resistor temperature coefficient is very high, approximately 1% per C. For circuits designed to operate over a wide temperature range (e.g. −55° to 125° C.), the hold time for latch circuit can be very long in order to achieve certain desired level of SEU immunity.

2. In gate array applications, where integrated circuit (IC) devices are fabricated by personalizing partially processed master slice wafers from stock, forming polysilicon resistors is not practical. The polysilicon personalization step is a step very early in the wafer fabrication.

SUMMARY OF THE INVENTION

An object of this invention is the provision of a radiation hardening circuit component that can be incorporated at a late stage in order to personalize a partially processed master slice wafer.

Another object of this invention is the provision of a hardening circuit whose parameters are relatively constant over a wide temperature range.

Briefly, this invention contemplates providing SEU immunity in a cross-coupled CMOS latch circuit by inserting a pair of series connected invertors between the drain node of one CMOS invertor and the gate node of the other CMOS invertor and a pair of series connected invertors between the drain node of the other CMOS invertor and the gate node of the one CMOS invertor. The invertor pairs delay the propagation of a change in voltage induced by an energetic ion strike at the off drain of one invertor to the gates of the transistors making up the other cross coupled invertor. The invertor connected to the gates of the transistors affected by the ion strike help in restoring the circuit to its original state.

BRIEF DESCRIPTION OF THE DRAWINGS

The foregoing and other objects, aspects and advantages will be better understood from the following detailed

Figure 1A:
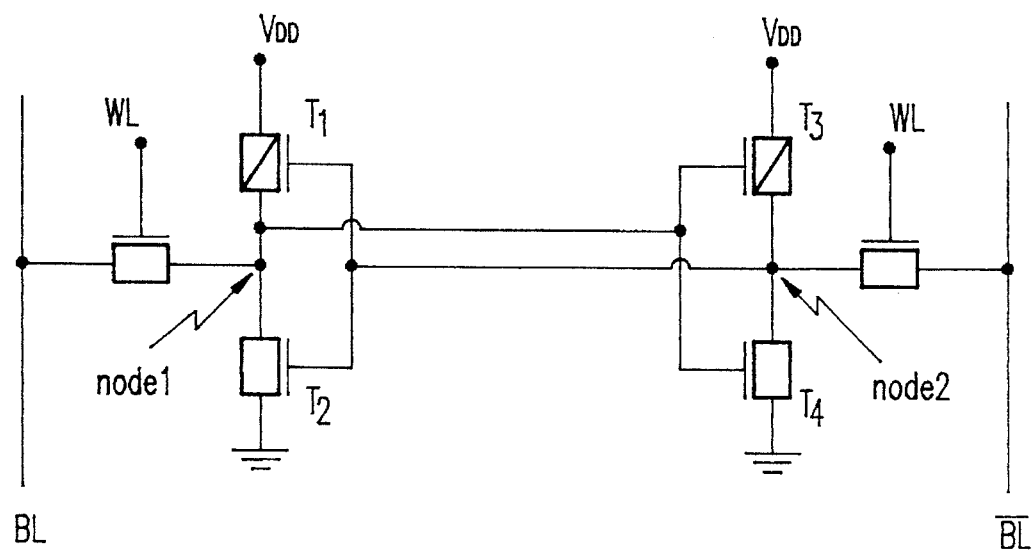
Figure 1B:
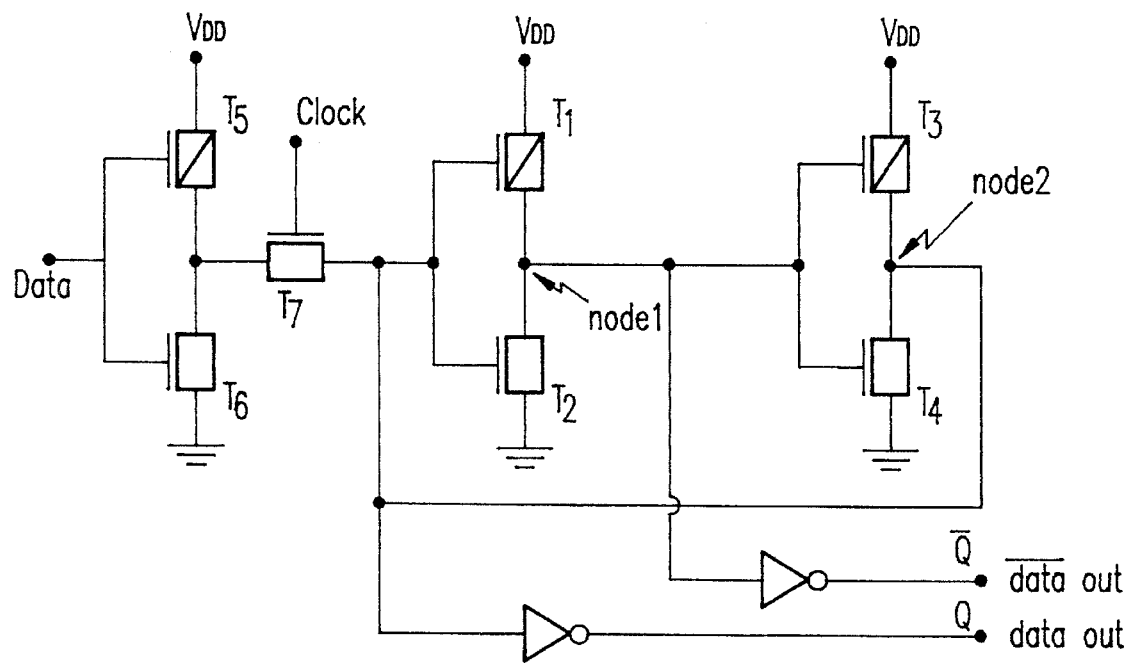

3 description of a preferred embodiment of the invention with reference to the drawings, in which:

FIGS. 1a and 1b are schematic drawings respectively of prior art unhardened SRAM and latch circuits.

Figure 2A:
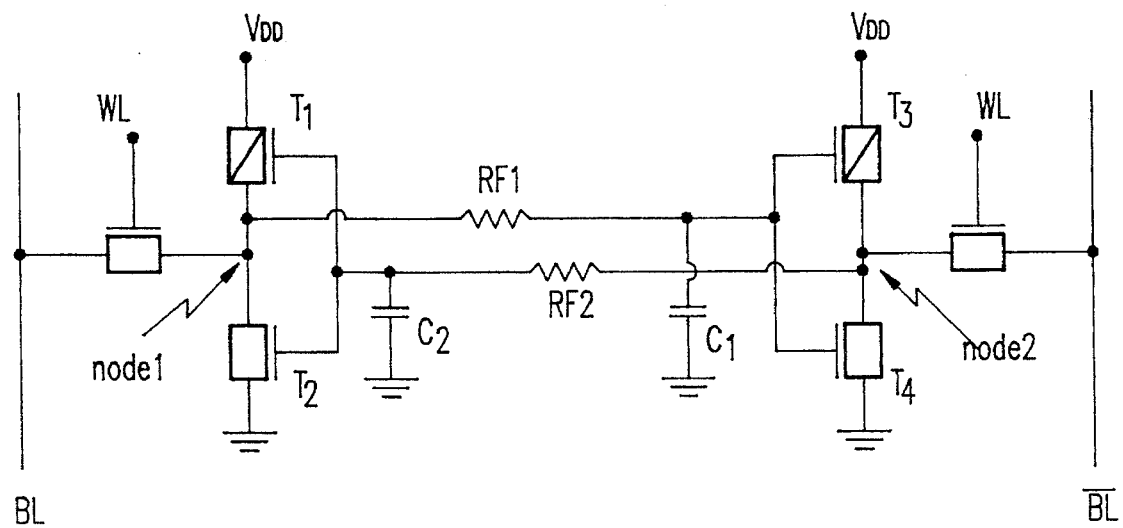
Figure 2B:
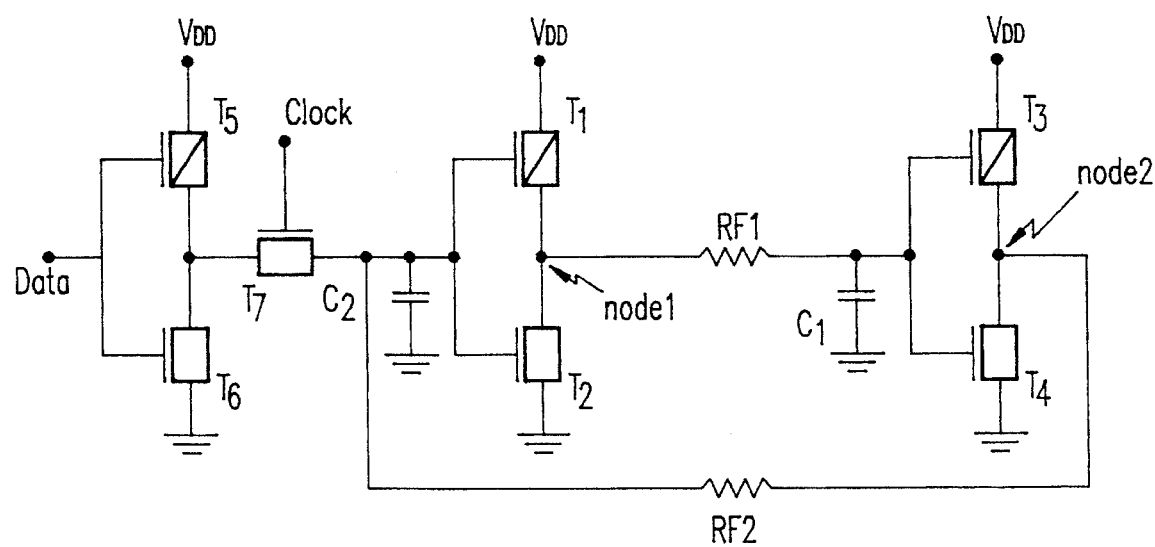

FIGS. 2a and 2b are schematic drawings, similar to FIGS. 1a and 1b, respectively, showing prior art circuits to radiation harden these circuits.

Figure 3:
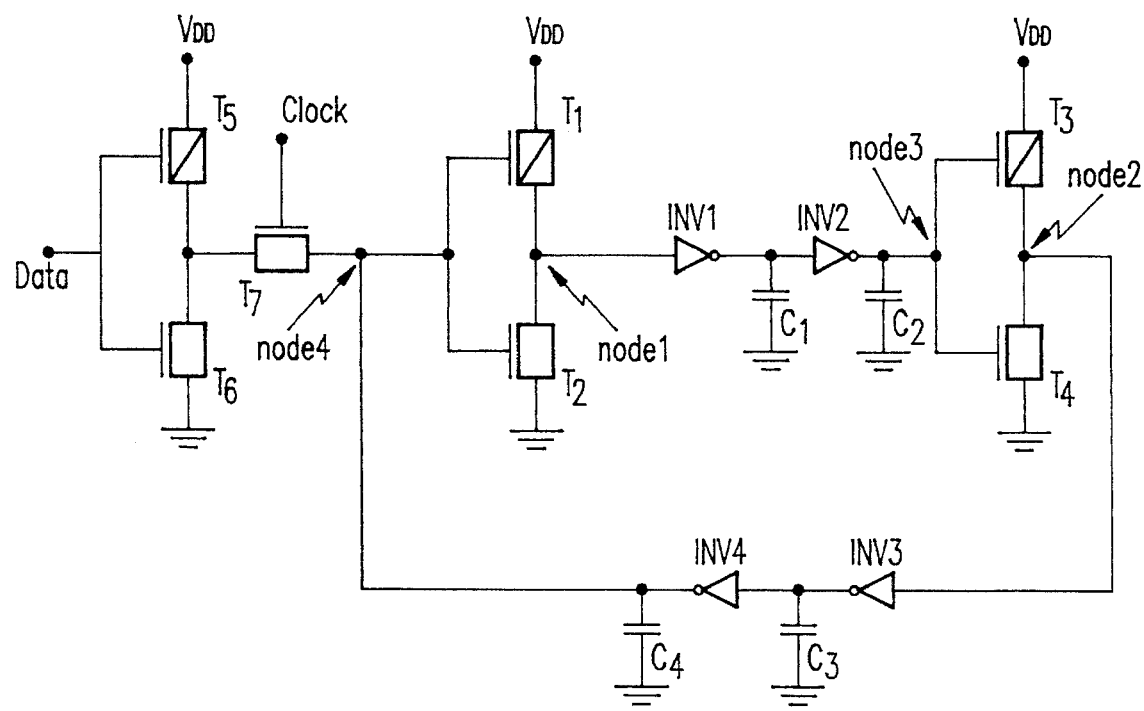

FIG. 3 is a latch circuit, similar to FIG. 1a, radiation hardened in accordance with the teachings of this invention.

Figure 4:
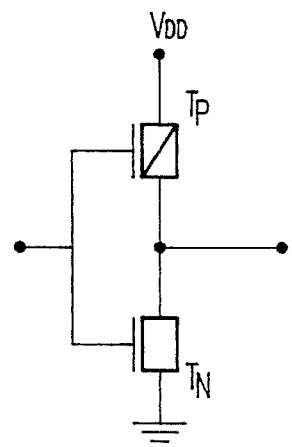
Figure 5:
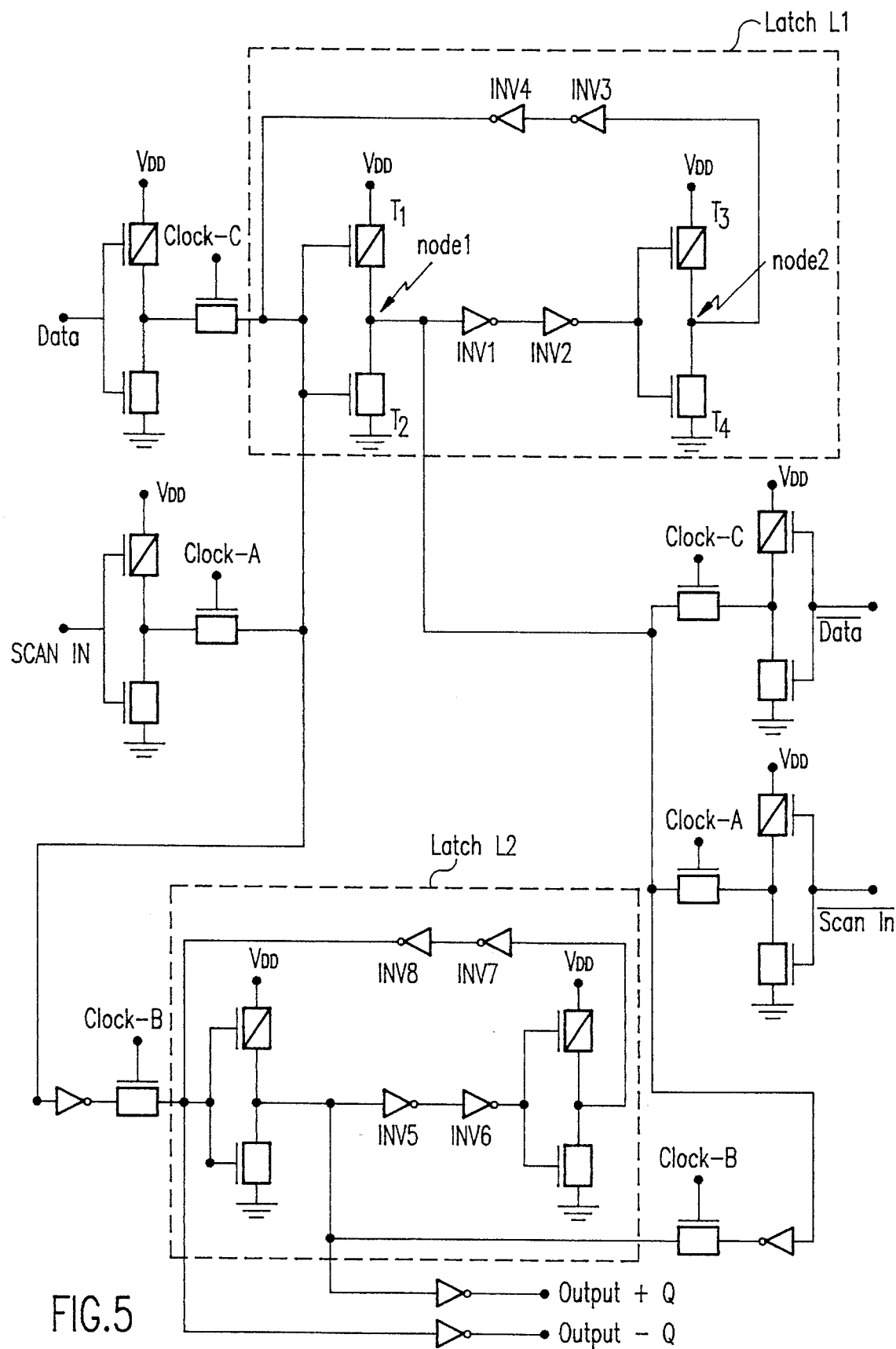

FIG. 4 is a schematic drawing of a preferred CMOS invertor circuit;

FIG. 5 is a schematic drawing of level sensitive scan latch circuit radiation hardened in accordance with the teachings of the invention.

DETAILED DESCRIPTION OF A PREFERRED EMBODIMENT OF THE INVENTION

Referring now to FIG. 3, transistors T1 and T2 make up one invertor, and T3 and T4 the other invertor of a cross coupled latch circuit of the type shown in FIG. 1b. In the SEU immune latch circuit in accordance with the teachings of this invention, two invertors in series, inv1 and inv2, are connected from the drains of T1 and T2 to the gates of T3 and T4. Similarly two invertors in series, inv3 and inv4, are connected from the drain of transistors T3 and T4 to the gates of T1 and T2. Capacitors C1, C2, C3 and C4 represent interconnection and parasitic capacitance. These invertor pairs (i.e. inv1-inv2 and inv3-inv4) provide a non-inverting delay from node 1 to node 3 and from node 2 to node 4, respectively. Invertors inv1, inv2, inv3 and inv4 are preferably formed of transistors Tp (P channel) and Tn (N channel) as shown in FIG. 4. The channel width and channel length of transistors Tp and Tn are selected to provide a desired delay and hence the level of SEU immunity needed. Data is entered in the latch circuit when the clock is at high voltage level. A high voltage level (logic state 1) at the data node will be inverted by the invertor made up with transistors T5 and T6, node 4 will be at low voltage level (logic state 0). Low voltage at node 4 will turn on T1 and turn off T2, bringing node 1 to high voltage level (logic state 1). Due to the inversions by inv1 and inv2, node 3 will be at the same voltage level as node 1, a high voltage level. T3 will turn off and T4 will turn on, bringing node 2 to a low voltage level (logic state 0) and this second invertor of the cross coupled latch will latch up the node 1 to a high voltage level. The latch circuit now is in a stable state even when the clock signal is at the low voltage level. Data is latched in the circuit with node 1 at high state and node 2 at the low state.

During the time clock is at a low voltage level, assume a high energy ion strikes node 1, and brings node 1 to a low voltage level. This change in voltage at node 1 is delayed by inv1 and inv2 and does not appear immediately at the gates of T3 and T4 and change node 3, and hence the latch's stable state. The invertors inv1 and inv2 also reduce the narrow pulse width of the induced voltage at node 1 due to the ion's strike still further before it reaches the gates of transistors T3 and T4 and making it less effective in changing the level at node 2. While the change in voltage at node 1 is propagating towards node 3, the low voltage level at the output of inv4 keeps T1 on and helps in restoring the node1 to its original high voltage level (logic state 1), keeping the latch states error free.

The circuit of FIG. 3 works in a similar fashion when node 1 is low and node 2 is high in the latch's stable state. If the high energy ion strikes the "off" drain of T1, inducing a high voltage at node 1, inv1 and inv2 delay this change in voltage at node 1 before it changes the gate voltage of transistors T3 and T4, and, in the time interval caused by the delay. The high level at the output of inv4 helps T2 to restore voltage at node 1.

Channel length and width for transistors Tp and Tn shown in FIG. 4 are selected to provide the delaying action and hence the immunity level for the latch circuit.

A level sensitive, scan shift register of a design known in the prior art, radiation hardened in accordance with the teachings of this invention, is shown in FIG. 5. Here two SEU hardened latches L1 and L2 of the type shown in FIG. 4 are used. The latches are written from both sides by Data and −Data. The latch is operated by non-overlapping clock C and clock B. Data is entered in L1 from Data and −Data nodes while clock C is high and clock B is low. Data from latch L1 is transferred to L2 when clock B is high and by definition of non-overlapping clocks, clock C is low. Data from latch L2 appears at SR output nodes +Q and −Q.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A single event upset hardened, bi-stable circuit, comprising in combination:

a first pair of CMOS semiconductor transistors with a common drain node and a common gate node;

a second pair of CMOS semiconductor transistors with a common drain node and a common gate node;

first means including a pair of series connected invertors coupling the common drain node of said first pair of CMOS semiconductor transistors to the common gate node of said second pair of CMOS semiconductor transistors; and second means including a pair of series connected invertors coupling the common drain node of said second pair of CMOS semiconductor transistors to the common gate node of said first pair of CMOS semiconductor transistors.

2. A single event upset hardened, bi-stable circuit as in claim 1, wherein each of said series connected invertors comprises a pair of CMOS transistors with a common gate node and a common drain node.

3. A single event upset hardened, bi-stable circuit as in claim 2, wherein the channel length and channel width of said pair of CMOS transistors which comprise each of said series connected invertors are selected to provide a predetermined delay to the propagation of a change of state between the common drain node of said first pair of CMOS semiconductor transistors and the common gate node of the second pair of CMOS semiconductor transistors and between the common drain node of the second pair of CMOS semiconductor transistors and the common gate node of the first pair of CMOS semiconductor transistors.

4. A single event upset hardened, bi-stable shift register bit circuit, comprising in combination:

a first bi-stable latch including:

a first pair of CMOS semiconductor transistors with a common drain node and a common gate node;

a second pair of CMOS semiconductor transistors with a common drain node and a common gate node;

first means including a pair of series connected invertors coupling the common drain node of said first pair of CMOS semiconductor transistors to the common gate node of said second pair of CMOS semiconductor transistors; and second means including a pair of series connected invertors coupling the common drain node of said second pair of CMOS semiconductor transistors to the common gate node of said first pair of CMOS semiconductor transistors;

a second bi-stable latch including:

a third pair of CMOS semiconductor transistors with a common drain node and a common gate node;

a fourth pair of CMOS semiconductor transistors with a common drain node and a common gate node;

third means including a pair of series connected invertors coupling the common drain node of said third pair of CMOS semiconductor transistors to the common gate node of said fourth pair of CMOS semiconductor transistors; and fifth means including a pair of series connected invertors coupling the common drain node of said fourth pair of CMOS semiconductor transistors to the common gate node of said third pair of CMOS semiconductor transistors.

5. A single event upset hardened, bi-stable shift register bit circuit as in claim 4, wherein each of said series connected invertors comprises a pair of CMOS transistors with a common gate node and a common drain node.

6. A single event upset hardened, bi-stable shift register bit circuit as in claim 5, wherein the channel length and channel width of said pair of CMOS transistors which comprise each of said series connected invertors are selected to provide a predetermined delay to the propagation of a change of state between the common drain node of said first pair of CMOS semiconductor transistors and the common gate node of the second pair of CMOS semiconductor transistors and between the common drain node of the second pair of CMOS semiconductor transistors and the common gate node of the first pair of CMOS semiconductor transistors.

* * * * *